United States Patent
Xu

(10) Patent No.: US 11,694,753 B2
(45) Date of Patent: Jul. 4, 2023

(54) MEMORY CELL SENSING

(71) Applicant: MICRON TECHNOLOGY, INC., Boise, ID (US)

(72) Inventor: Jun Xu, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/718,435

(22) Filed: Apr. 12, 2022

(65) Prior Publication Data

US 2022/0238165 A1 Jul. 28, 2022

Related U.S. Application Data

(63) Continuation of application No. 17/087,738, filed on Nov. 3, 2020, now Pat. No. 11,315,641.

(51) Int. Cl.
*G11C 16/26* (2006.01)
*G11C 16/12* (2006.01)
*G11C 16/30* (2006.01)
*G11C 16/34* (2006.01)
*H03K 19/17728* (2020.01)

(52) U.S. Cl.
CPC .......... *G11C 16/26* (2013.01); *G11C 16/12* (2013.01); *G11C 16/30* (2013.01); *G11C 16/3404* (2013.01); *H03K 19/17728* (2013.01)

(58) Field of Classification Search
CPC ......... G11C 16/26; G11C 16/12; G11C 16/30; G11C 16/3404; G11C 11/1673; G11C 2207/063; G11C 16/0483; H03K 19/17728
See application file for complete search history.

(56) References Cited

U.S. PATENT DOCUMENTS 10,049,752 B1   8/2018 Tang et al.
2018/0374518 A1* 12/2018 Tseng .................. G11C 16/0483

OTHER PUBLICATIONS

Marotta et al., "Nonvolatile Memory Technlogies with Emphasis on Flash", IEEE Press, Jan. 1, 2008, XP055903676, pp. 1-90.

* cited by examiner

*Primary Examiner* — Xiaochun L Chen
(74) *Attorney, Agent, or Firm* — Dicke, Billig & Czaja, PLLC

(57) ABSTRACT

Memory might include a controller configured to cause the memory to capacitively couple a first voltage level from a voltage node to a node of a sense circuit, selectively discharge the node of the sense circuit through a memory cell, measure a current demand of the voltage node while selectively discharging the node of the sense circuit through the memory cell, determine a second voltage level in response to the measured current demand, isolate the node of the sense circuit from the memory cell, capacitively couple the second voltage level from the voltage node to the node of the sense circuit, and determine a data state of the memory cell in response to a voltage level of the node of the sense circuit while capacitively coupling the second voltage level to the node of the sense circuit.

22 Claims, 11 Drawing Sheets

MEMORY CELL SENSING

RELATED APPLICATION

This application is a Continuation of U.S. application Ser. No. 17/087,738, titled "MEMORY CELL SENSING," filed Nov. 3, 2020, (allowed) which is commonly assigned and incorporated herein by reference.

TECHNICAL FIELD

The present disclosure relates generally to integrated circuits, and, in particular, in one or more embodiments, the present disclosure relates to apparatus and methods for programming of memory cells.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells might be programmed as what are often termed single-level cells (SLC). SLC may use a single memory cell to represent one digit (e.g., one bit) of data. For example, in SLC, a Vt of 2.5V or higher might indicate a programmed memory cell (e.g., representing a logical 0) while a Vt of −0.5V or lower might indicate an erased memory cell (e.g., representing a logical 1). Such memory might achieve higher levels of storage capacity by including multi-level cells (MLC), triple-level cells (TLC), quad-level cells (QLC), etc., or combinations thereof in which the memory cell has multiple levels that enable more digits of data to be stored in each memory cell. For example, MLC might be configured to store two digits of data per memory cell represented by four Vt ranges, TLC might be configured to store three digits of data per memory cell represented by eight Vt ranges, QLC might be configured to store four digits of data per memory cell represented by sixteen Vt ranges, and so on.

Sensing (e.g., reading or verifying) a data state of a memory cell often involves detecting whether the memory cell is activated in response to a particular voltage applied to its control gate, such as by detecting whether a data line connected to the memory cell experiences a change in voltage level caused by current flow through the memory cell. As memory operation advances to represent additional data states per memory cell, the margins between adjacent Vt ranges can become smaller. This can lead to an inaccurate determination of the data state of a sensed memory cell if the Vt of the sensed memory cell shifts over time.

Threshold voltages of memory cells may shift due to such phenomena as quick charge loss (QCL). QCL is a de-trapping of electrons near a gate dielectric interface out to the channel region of the memory cell, and can cause a Vt shift shortly after a programming pulse. When a memory cell passes the verify operation, the programmed threshold voltage may appear to be higher due to the trapped charge in the gate dielectric. When the memory cell is read after the program operation has been completed, the memory cell may have a Vt that is lower than the Vt obtained during the program verify operation due to the charge in the gate dielectric leaking out to the channel region.

Threshold voltages of memory cells may further shift due to cumulative charge loss over the age of their programmed data, e.g., a period of time between programming the data and reading the data, referred to herein as data age. Such charge loss can become more pronounced as the data storage structures become smaller.

Furthermore, threshold voltages of memory cells may shift due to read disturb. In read disturb, the threshold voltage of a memory cell may shift in response to the voltage applied to the memory cell to facilitate access to the target memory cell selected for reading, e.g., increasing the threshold voltage of the memory cell.

DETAILED DESCRIPTION

Figure 1:
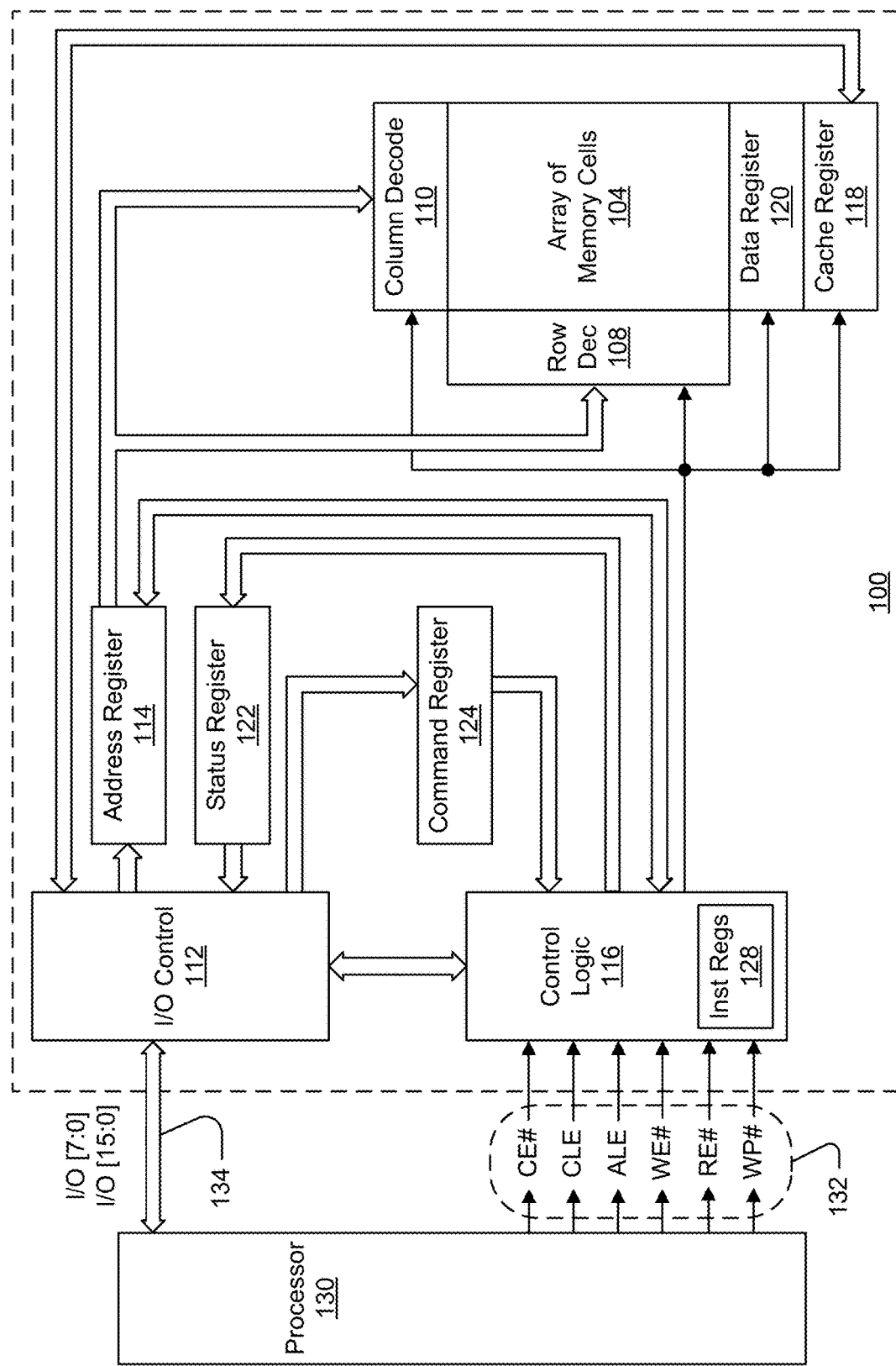
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown)

might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
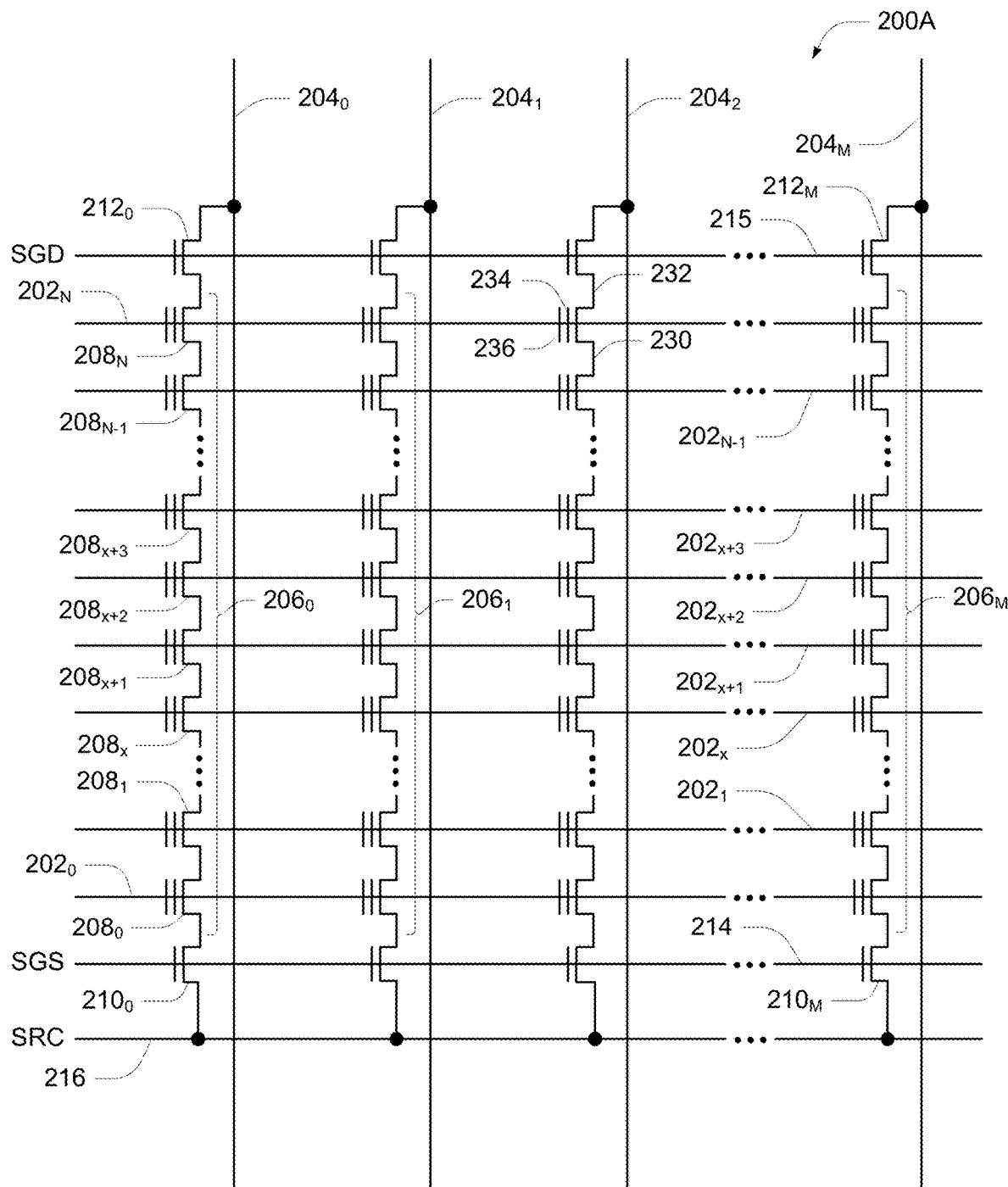
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
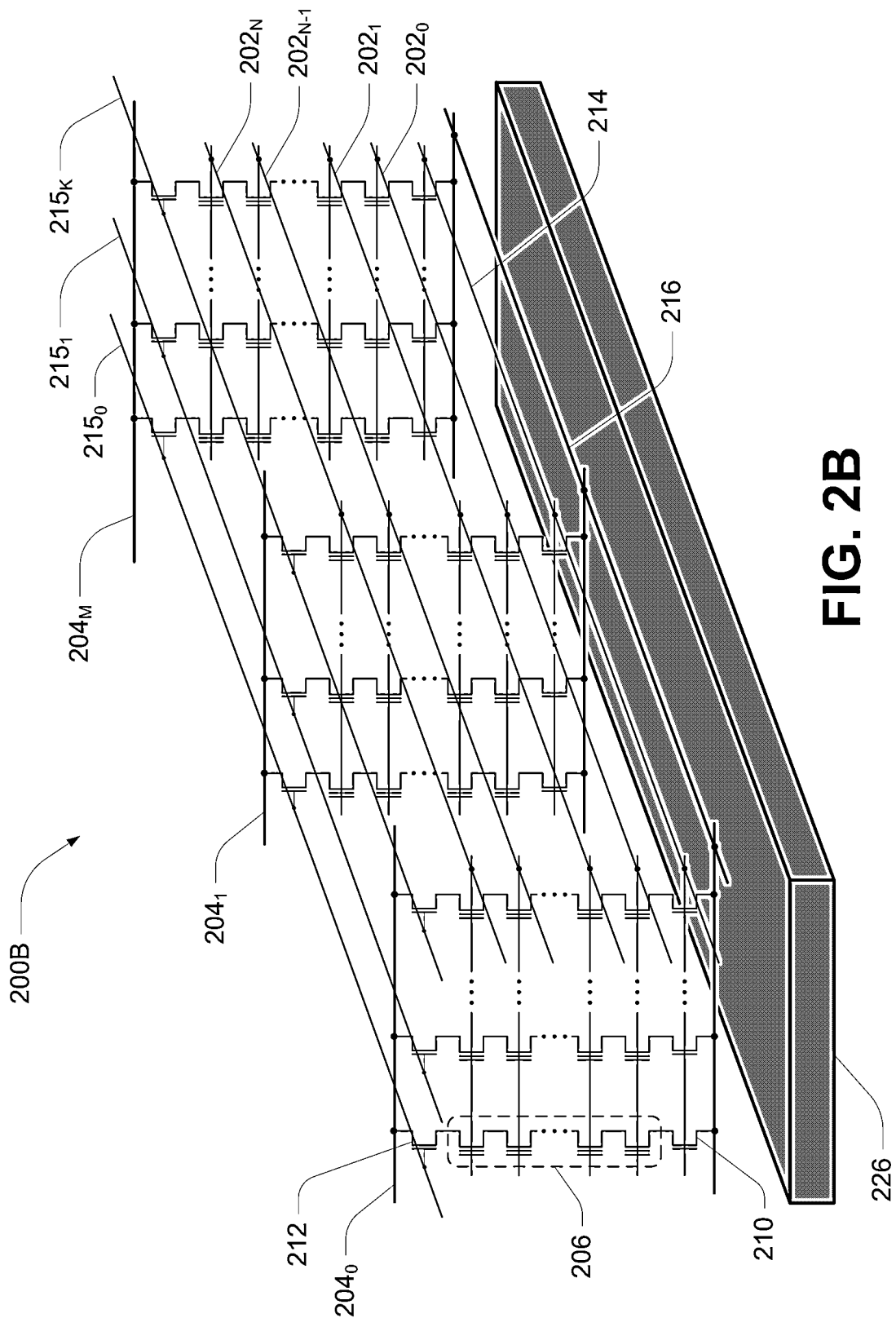

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
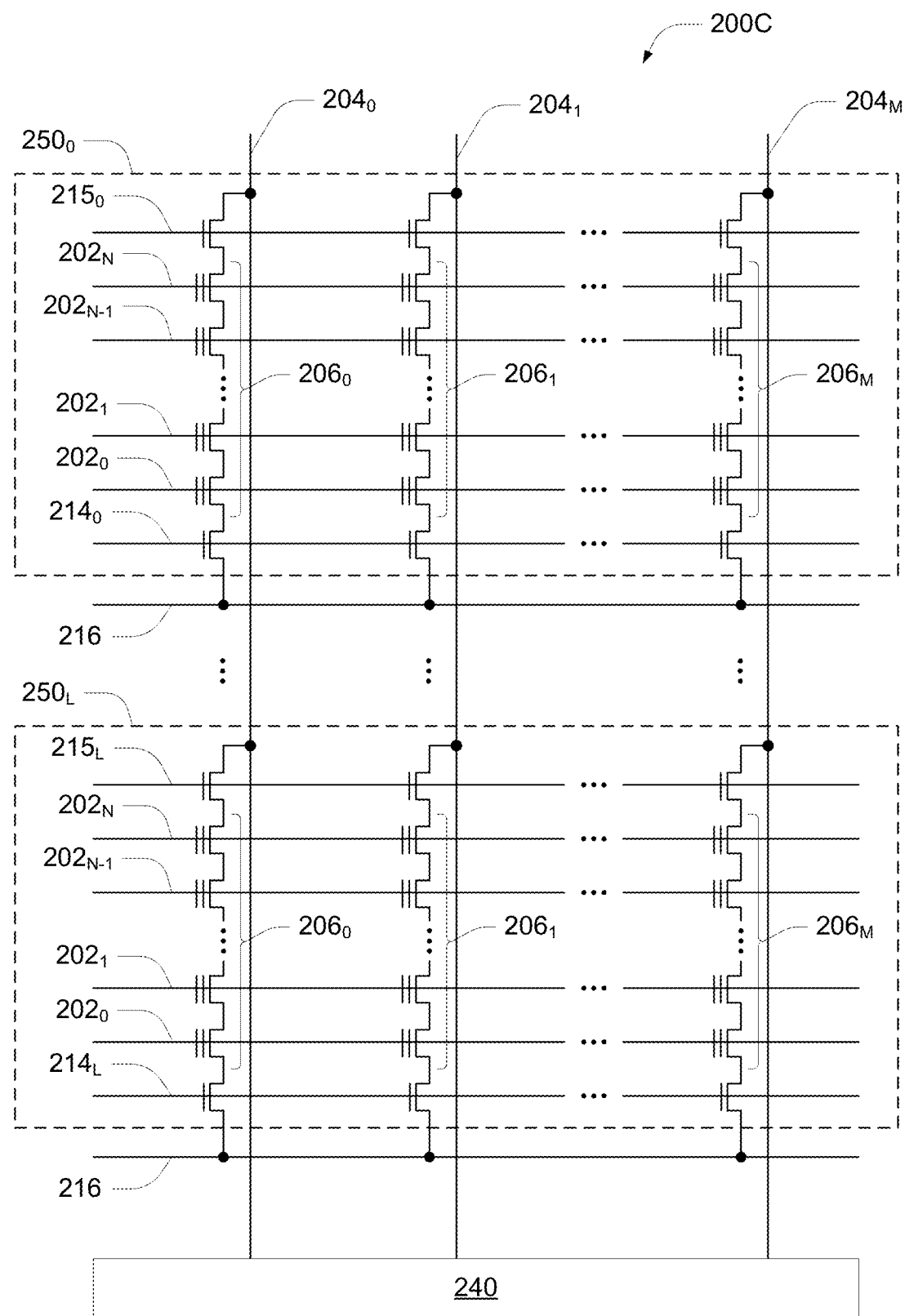

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$-$250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$-$250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$-$250_L$.

The data lines $204_0$-$204_M$ may be connected (e.g., selectively connected) to a buffer portion 240, which might be a portion of a data buffer of the memory. The buffer portion 240 might correspond to a memory plane (e.g., the set of blocks of memory cells $250_0$-$250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines 215$_1$-215$_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3:
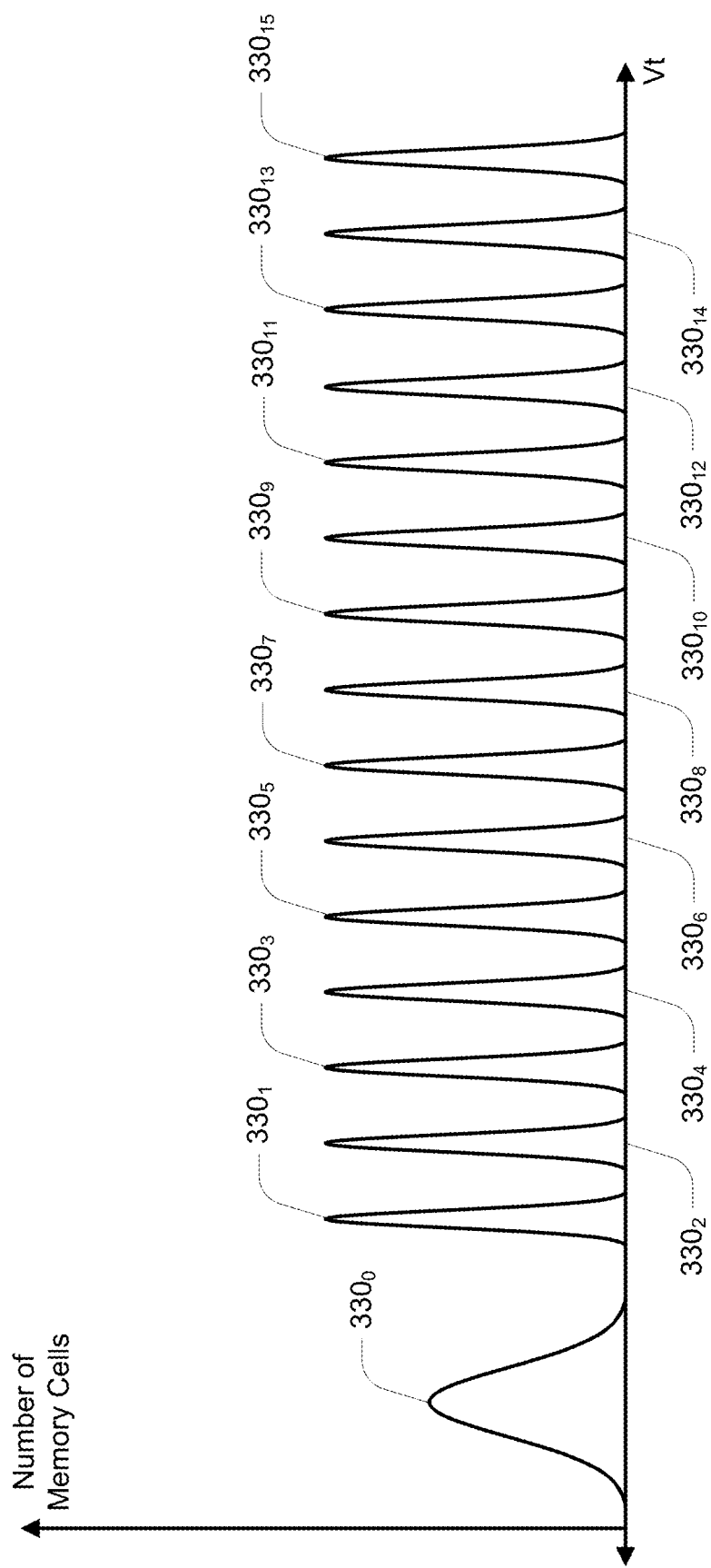
FIG. 3 is a conceptual depiction of threshold voltage distributions of a plurality of memory cells.

FIG. 3 is a conceptual depiction of threshold voltage ranges of a plurality of memory cells. FIG. 3 illustrates an example of threshold voltage ranges and their distributions for a population of a sixteen-level memory cells, often referred to as QLC memory cells. For example, such a memory cell might be programmed to a threshold voltage (Vt) that falls within one of sixteen different threshold voltage ranges 330$_0$-330$_{15}$, each being used to represent a data state corresponding to a bit pattern of four bits. The threshold voltage range 330$_0$ typically has a greater width than the remaining threshold voltage ranges 330$_1$-330$_{15}$ as memory cells are generally all placed in the data state corresponding to the threshold voltage range 330$_0$, then subsets of those memory cells are subsequently programmed to have threshold voltages in one of the threshold voltage ranges 330$_1$-330$_{15}$. As programming operations are generally more incrementally controlled than erase operations, these threshold voltage ranges 330$_1$-330$_{15}$ may tend to have tighter distributions.

The threshold voltage ranges 330$_0$, 330$_1$, 330$_2$, 330$_3$, 330$_4$, 330$_5$, 330$_6$, 330$_7$, 330$_8$, 330$_9$, 330$_{10}$, 330$_{11}$, 330$_{12}$, 330$_{13}$, 330$_{14}$ and 330$_{15}$ might each represent a respective data state, e.g., L0, L1, L2, L3, L4, L5, L6, L7, L8, L9, L10, L11, L12, L13, L14 and L15, respectively. As an example, if the threshold voltage of a memory cell is within the first of the sixteen threshold voltage ranges 330$_0$, the memory cell in this case may be storing a data state L0 having a data value of logical '1111' and is typically referred to as the erased state of the memory cell. If the threshold voltage is within the second of the sixteen threshold voltage ranges 330$_1$, the memory cell in this case may be storing a data state L1 having a data value of logical '0111'. If the threshold voltage is within the third of the sixteen threshold voltage ranges 330$_2$, the memory cell in this case may be storing a data state L2 having a data value of logical '0011', and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state. The information of Table 1 might be contained within the trim register 128, for example.

TABLE 1

| Data State | Logical Data Value |
| --- | --- |
| L0 | 1111 |
| L1 | 0111 |
| L2 | 0011 |
| L3 | 1011 |
| L4 | 1001 |
| L5 | 0001 |
| L6 | 0101 |
| L7 | 1101 |
| L8 | 1100 |
| L9 | 0100 |

TABLE 1-continued

| Data State | Logical Data Value |
| --- | --- |
| L10 | 0000 |
| L11 | 1000 |
| L12 | 1010 |
| L13 | 0010 |
| L14 | 0110 |
| L15 | 1110 |

As memory cells are reduced in size, their associated data storage structures generally become smaller. In addition, as more levels of data states are stored to memory cells, differentiation between data states may become more difficult.

Figure 4A:
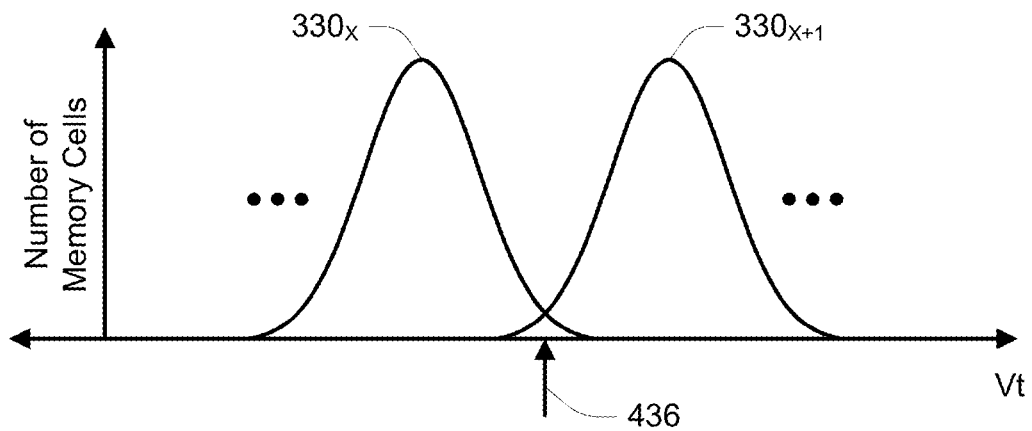
FIGS. 4A-4C are conceptual depictions of adjacent threshold voltage distributions.
Figure 4B:
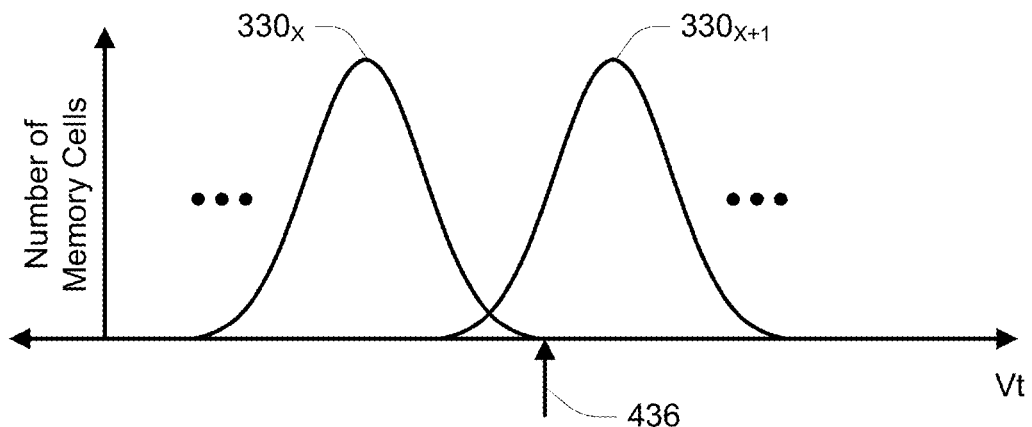
Figure 4C:
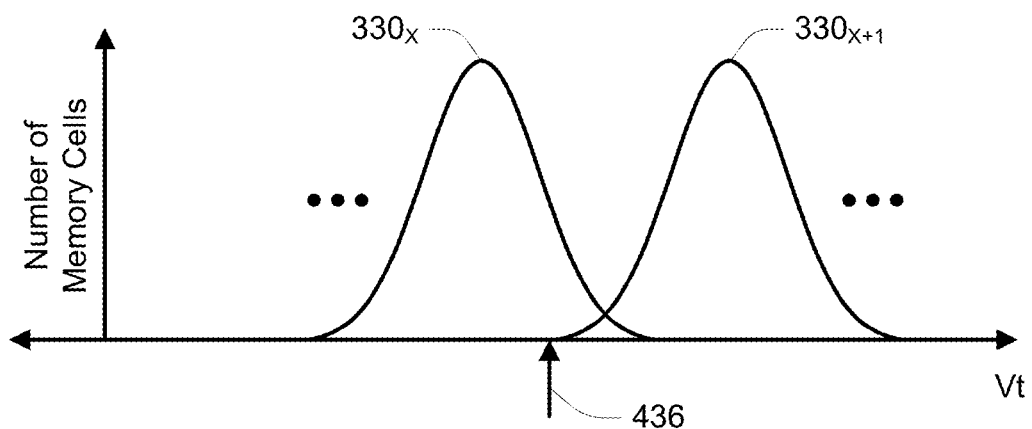

FIGS. 4A-4C are conceptual depictions of threshold voltage distributions. Threshold voltages of memory cells may shift due to read disturb and/or other phenomena, such as quick charge loss (QCL) and cumulative charge loss. In read disturb, the threshold voltage of a memory cell may shift in response to the voltage applied to the memory cell to facilitate access to the target memory cell selected for sensing, e.g., increasing the threshold voltage of the memory cell. QCL is a de-trapping of electrons near a gate dielectric interface out to the channel region of the memory cell, and can cause an immediate Vt shift after a programming pulse. When a memory cell passes the verify operation, the programmed threshold voltage may appear to be higher due to the trapped charge in the gate dielectric. When the memory cell is subsequently sensed, the memory cell may have a Vt that is lower than the Vt obtained during the program verify operation due to the charge in the gate dielectric leaking out to the channel region. Cumulative charge loss might occur over the age of the programmed data, e.g., a period of time between programming the data and sensing the data. Such charge loss can become more pronounced as the data storage structures become smaller. These phenomena can make accurate determination of data states more difficult as the threshold voltage of a memory cell may shift enough to place it in the threshold voltage distribution of a data state that is different than its original target data state.

FIG. 4A is a conceptual depiction of threshold voltage distributions following programming, e.g., without a net charge loss or net charge gain. The threshold voltage distributions 330$_X$ and 330$_{X+1}$ might represent any two adjacent threshold voltage distributions representing the data states to which the memory cells might be assigned, i.e., X could have any integer value 0-14 for the example of FIG. 3. Threshold voltage distributions generally experience spread following programming, which can lead to overlap of the threshold voltage distributions of memory cells programmed to the corresponding data states as depicted for the threshold voltage distributions 330$_X$ and 330$_{X+1}$. Arrow 436 might represent a sense voltage used to distinguish between these two data states, e.g., a memory cell being deemed to first activate in response to the voltage level corresponding to the arrow 436 might be deemed to be within the threshold voltage distribution 330$_X$. Ideally, a sense voltage at a local minima between two threshold voltage distributions, such as depicted in FIG. 4A, might be expected to most accurately assign memory cells of the two adjacent threshold voltage distributions to the correct data states.

FIG. 4B is a conceptual depiction of the threshold voltage distributions 330$_X$ and 330$_{X+1}$ shifting due to charge loss, e.g., that might occur due to QCL and/or cumulative charge loss. In response to charge loss, the threshold voltage distributions $330_X$ and $330_{X+1}$ might generally shift lower relative to the sense voltage. With the sense voltage higher than the local minima, additional memory cells of the threshold voltage distribution $330_X$ might be accurately assigned, but more memory cells of the threshold voltage distribution $330_{X+1}$ might be incorrectly assigned. FIG. 4C is a conceptual depiction of the threshold voltage distributions $330_X$ and $330_{X+1}$ shifting due to charge gain, e.g., that might result from read disturb. In response to charge gain, the threshold voltage distributions $330_X$ and $330_{X+1}$ might generally shift higher relative to the sense voltage. With the sense voltage lower than the local minima, additional memory cells of the threshold voltage distribution $330_{X+1}$ might be accurately assigned, but more memory cells of the threshold voltage distribution $330_X$ might be incorrectly assigned. Such competing phenomena, some raising threshold voltages and some lowering threshold voltages, may complicate the reliable sensing of data states over the life of the memory device. Various embodiments seek to determine data states of memory cells despite these variations in threshold voltage distributions.

Figure 5:
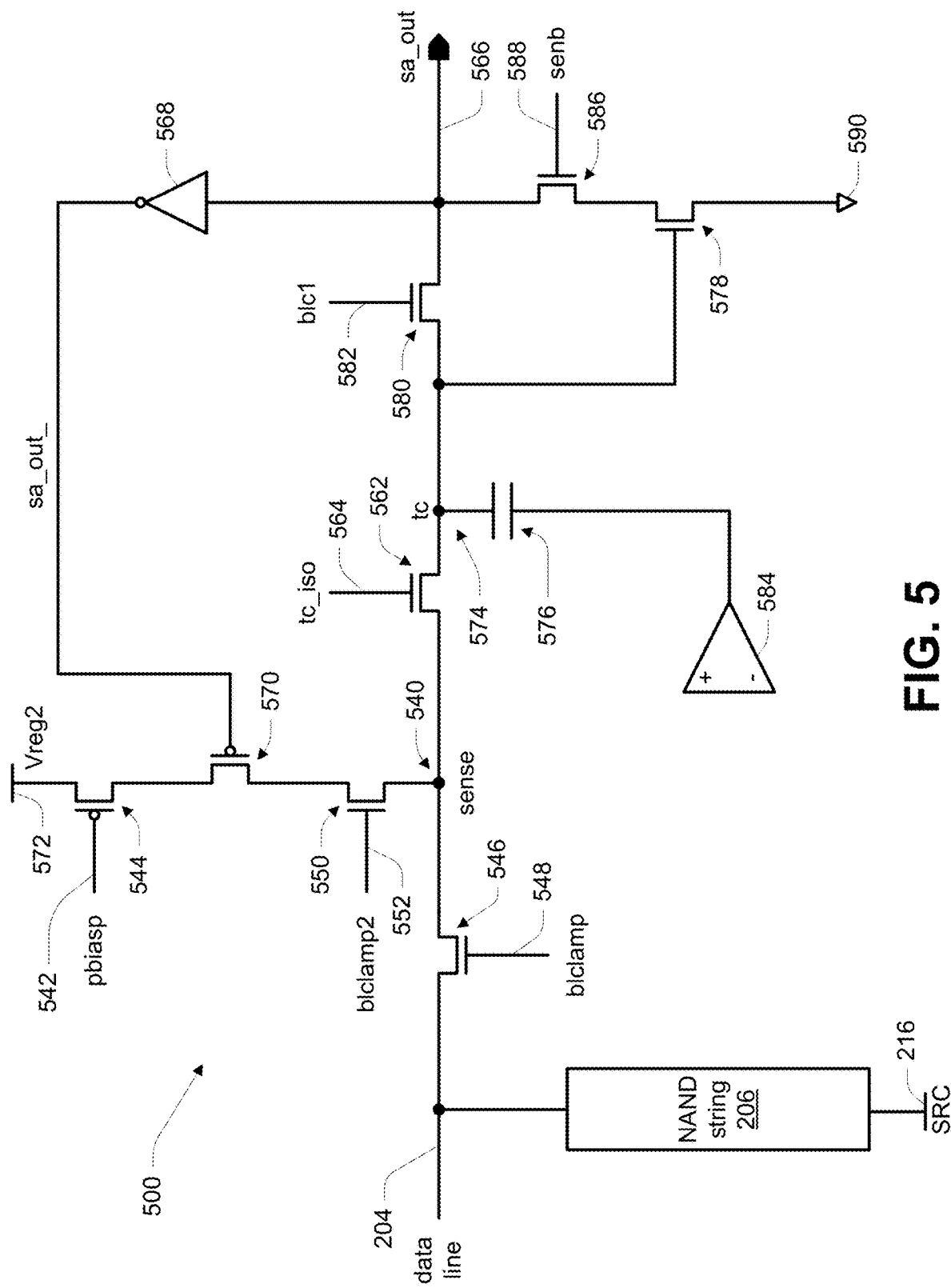
FIG. 5 is a schematic of a sense circuit of a type that might be used with various embodiments.

Sense circuits are typically utilized in memory devices to facilitate performing a sense (e.g., read and/or verify) operation on each of one or more selected (e.g., target) memory cells in the memory device. A sense operation might be a read operation, e.g., for providing data output from the array of memory cells, or a verify operation, e.g., for verifying whether a programming pulse successfully changed a threshold voltage of a target memory cell to indicate its desired data state. FIG. 5 illustrates a sense circuit 500 of a type that might be used with various embodiments. Sense circuit 500 is shown connected to a particular NAND string 206 by a particular data line 204, such as shown in more detail in FIG. 2A, for example. Note that select transistors 210 and 212 selectively connecting the NAND string 206 to the source 216 and data line 204, respectively, are not shown in FIG. 5. While the discussion is directed to use of the sense circuit 500 with a NAND string 206, other memory structures and architectures are suitable for use with sense circuit 500 where a current path can be selectively created between the data line 204 and the source 216 dependent upon a data state of a memory cell selected for sensing.

As part of a sense operation, e.g., a precharge portion of the sense operation, the sense circuit 500 may precharge the sense node 540, tc node 574 and the data line 204 by activating a precharge transistor (e.g., p-type field effect transistor, or pFET) 544 by biasing (e.g., driving) the signal line 542 to a particular voltage level (e.g., a voltage level of control signal pbiasp) sufficient to activate the transistor 544, by activating a first clamp transistor (e.g., n-type field effect transistor, or nFET) 546 by biasing the signal line 548 to a particular voltage level (e.g., a voltage level of control signal blclamp) sufficient to activate the transistor 546, by activating a second clamp transistor (e.g., nFET) 550 by biasing the signal line 552 to a particular voltage level (e.g., a voltage level of control signal blclamp2) sufficient to activate the transistor 550, and by activating an isolation transistor (e.g., nFET) 562 by biasing the signal line 564 to a particular voltage level (e.g., a voltage level of control signal tc_iso) sufficient to activate the transistor 562. Control signals of the sense circuit 500 may be provided by the internal controller (e.g., control logic 116) of the memory device 100. Such control signals (e.g., both voltage levels and timing) may be defined by the sense operation and are distinguished from signals generated in response to performing the sense operation (e.g., the voltage level generated at the output 566 of the sense circuit 500 (e.g., the output signal sa_out), a voltage level generated on the sense node 540, or a voltage level generated on the tc node 562). The output 566 might have an initial logic high level during the precharge portion of the sense operation, and might be connected to the input of an inverter 568, such that a transistor 570 (e.g., pFET), having its control gate connected to the output of the inverter 568, might be activated. This might connect the sense node 540, the tc node 574. and the data line 204 to the voltage node 572 configured to receive a voltage level Vreg2.

The tc node 574 might be connected to one electrode of a capacitance (e.g., capacitor) 576, to the control gate of a transistor (e.g., nFET) 578, and to a source/drain of a transistor (e.g., nFET) 580 having its control gate connected to signal line 582 configured to receive the control signal blc1. The transistor 580 might remain deactivated during the sense operation. The capacitance 576 might have its second electrode connected to the output of a variable voltage node (e.g., voltage regulator) 584. The variable voltage node 584 might further be connected to one or more additional capacitances 576 of other sense circuits 500. Although the capacitance 576 is depicted in FIG. 5 as a capacitor, it should be recognized that, in other examples, capacitance 576 can refer to a portion (which may include one or more active/passive elements) of a circuit (e.g., sense circuit) having a capacitance (e.g., a predefined capacitance) and configured to influence (e.g., capacitively influence) a voltage level of the tc node 574 in response to an applied voltage from the voltage node 584.

A sense enable transistor (e.g., nFET) 586 might be connected between a source/drain of the transistor 578 and the output 566 of the sense circuit 500, and might have its control gate connected to the signal line 588 configured to receive the control signal senb. The transistor 578 might have its other source/drain connected to a voltage node (e.g., reference potential node) 590. The voltage node 590 might be configured to receive a reference potential, such as a ground, 0V or the supply voltage Vss.

Following the precharging of the tc node 574 and the data line 204, additional portions of the sense operation might be performed to detect whether or not the precharged data line 204 and tc node 574 is discharged during the sense operation, thereby determining the data state of the memory cell selected for sensing. In general, following the precharging of the tc node 574 and the data line 204, the data line 204 can then be selectively connected to the source 216 depending upon whether the memory cell selected for sensing is activated or deactivated in response to a sense voltage applied to its control gate. The data line 204 and tc node 574 might then be given an opportunity to discharge, if current is flowing through the NAND string 206. If a voltage level of the data line 204 is lower than the precharge voltage level due to current flow through the NAND string 206, the voltage level of the tc node 574 will likewise experience a drop. If the voltage level of the data line 204 remains at the precharge voltage level, such as when the memory cell selected for sensing remains deactivated, the voltage level of the tc node 574 may remain at its precharge (or boosted) voltage level. The tc note 574 might then be isolated from the data line 204, e.g., by deactivating the transistor 562 and/or the transistor 546.

While the transistor 586 activated, and the voltage level of the tc node 574 applied to the control gate of the transistor 578, the voltage node 590 may be selectively connected to the output 566 depending upon a voltage level of the tc node 574. The output 566 may have a particular logic level (e.g., logic high) prior to sensing. If the voltage level of the voltage node 590 is applied to the output 566 upon activation of the transistor 586, its logic level may change, e.g., from a logic high level to a logic low level, and if the voltage node 590 remains isolated from the output 566 upon activation of the transistor 586, its logic level may remain at the particular logic level.

Various embodiments may utilize boosting and deboosting of the tc node 574 during the sense operation. Boosting (e.g., capacitively coupling a first boost voltage level to) and deboosting (e.g., capacitively coupling a second, lower, deboost voltage level to) the tc node 574 might be used, for example, to facilitate a higher develop overhead. By boosting the tc node 574 prior to the sense node develop time, the voltage level of the tc node 574 can be allowed to develop longer without prematurely indicating current flow of the data line 204. Subsequent deboosting of the tc node 574 after isolation from the NAND string 206 from the data line 204 may permit the voltage level of the tc node 574 to drop below the trip point (e.g., threshold voltage) of the transistor 578 to indicate that current flow (e.g., a threshold level of current flow) was detected.

The trip point of the sense circuit 500 may generally be dependent upon the threshold voltage of the transistor 578. The sense circuit 500 is typically configured to have a trip point (e.g., sense threshold level) close to the precharge voltage level that may be established on the tc node 574 prior to sensing the selected memory cell. The trip point might be a particular voltage level on the tc node 574 wherein the sense circuit 500 outputs a first logic level indicative of a first state of the tc node 574, e.g., when the voltage level of the tc node 574 is equal to or above the trip point. The sense circuit 500 might output a second logic level indicative of a second state of the tc node 574, e.g., when the voltage level of the tc node 574 is below the trip point, for example. The state of the tc node 574 can be used to provide an indication of the data state of the sensed memory cell.

It is noted that data lines corresponding to activated memory cells having threshold voltages nearer the sense voltage applied to their control gates might be expected to experience lower levels of discharge and higher resulting voltage levels of the tc node 574 than data lines corresponding to activated memory cells having threshold voltages farther from the sense voltage applied to their control gates. This phenomena might be expected to alter current demand from the capacitance 576 in response to varying voltage levels of the tc node 574.

Various embodiments utilize an indication of current demand of a capacitance 576 during a sensing operation to estimate the conditions that might indicate activation of those memory cells having threshold voltages below the local minima of two adjacent threshold voltage distributions, and might indicate deactivation of those memory cells having threshold voltages above that local minima. By gaining information about a magnitude and direction of the shift of the threshold voltage distributions, decisions about deboosting conditions might be informed.

Figure 6:
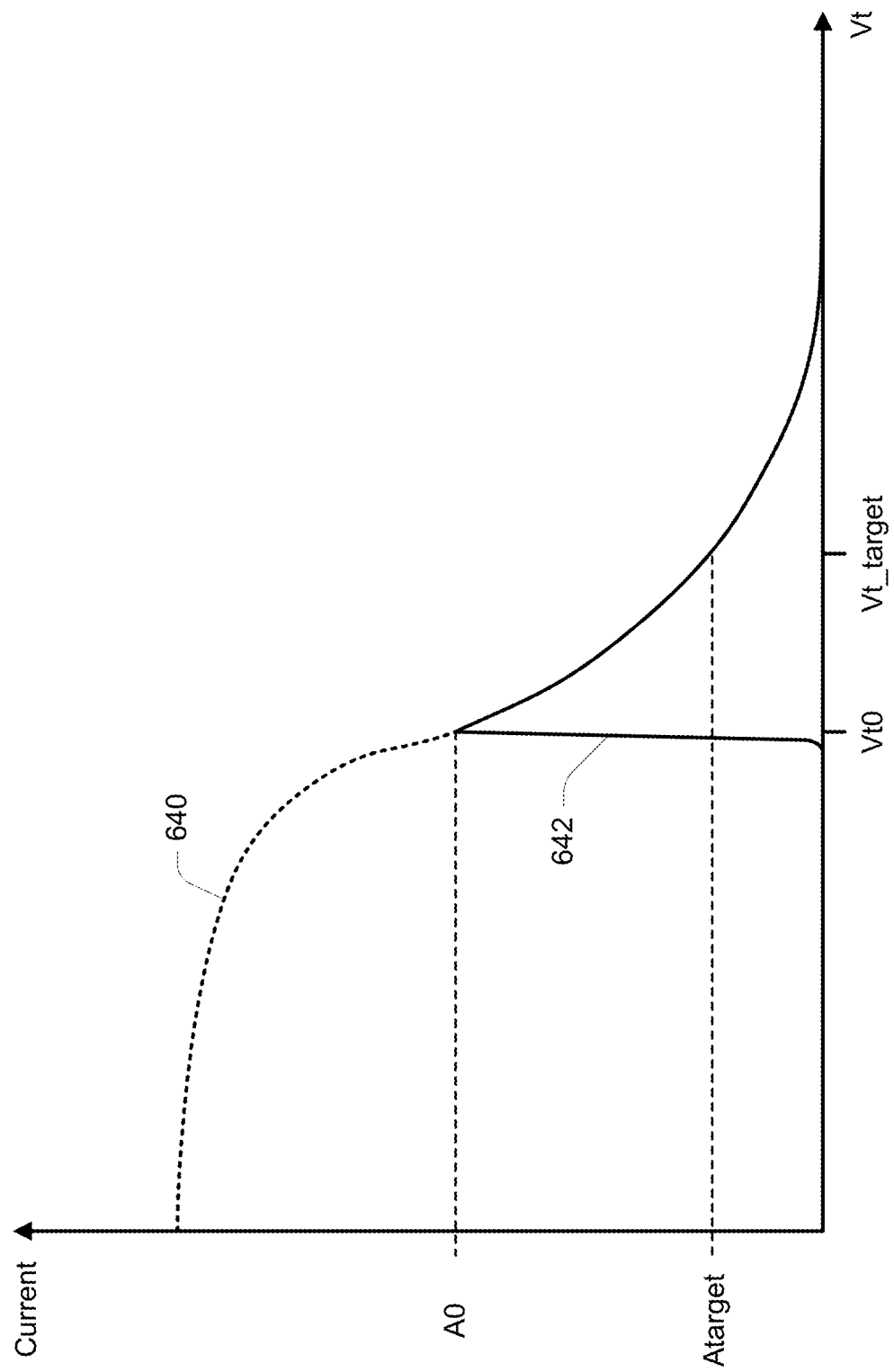
FIG. 6 is a conceptual depiction of current flow through a memory cell as a function of threshold voltage in response to an applied control gate voltage in accordance with an embodiment.

FIG. 6 is a conceptual depiction of current flow through a memory cell as a function of threshold voltage in response to an applied control gate voltage in accordance with an embodiment. The current level of the memory cell might be represented by the line 640. Vt_target might represent a target threshold voltage, and might correspond to the voltage level applied to a selected access line for a sensing operation of one or more memory cells connected to that access line. It might be desired to deem a memory cell having a current flow of less than Atarget as being deactivated in response to applying the sense voltage to its control gate. It is noted, however, that there might be an expectation that memory cells having threshold voltages above Vt_target might experience some current flow, albeit less than the target current flow Atarget. Similarly, there might be an expectation that memory cells having threshold voltages below Vt_target might experience current flows higher that the target current level Atarget.

With reference to the sense circuit 500, current flows higher than the current level A0 might initially be supplied from the capacitance 576, but might be subsequently supplied by the voltage node 572. The current level A0 might be dependent upon a voltage level applied to the capacitance 576 by the variable voltage node 584. Current flows lower than the current level A0, occurring at the threshold voltage level Vt0, might be supplied from the capacitance 576 in response to the voltage level applied by the variable voltage node 584. The line 642 might represent a steady-state current demand on the variable voltage node 584 as a function of the threshold voltage level of the memory cell. As depicted, the steady-state current demand on the variable voltage node 584 might equal the current level A0 at the threshold voltage level Vt0, and might follow the current level of the memory cell for threshold voltage levels above the threshold voltage level Vt0.

Figure 7A:
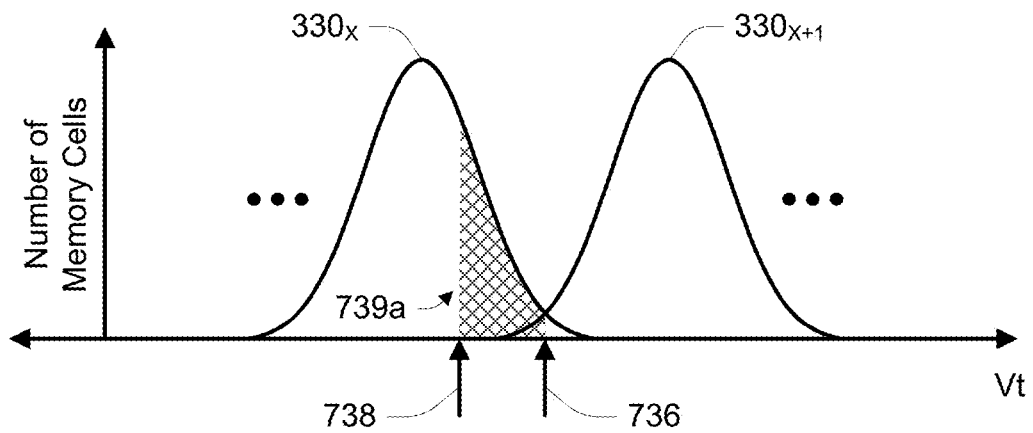
FIGS. 7A-7C are conceptual depictions of adjacent threshold voltage distributions such as depicted in FIGS. 4A-4C in accordance with embodiments.
Figure 7B:
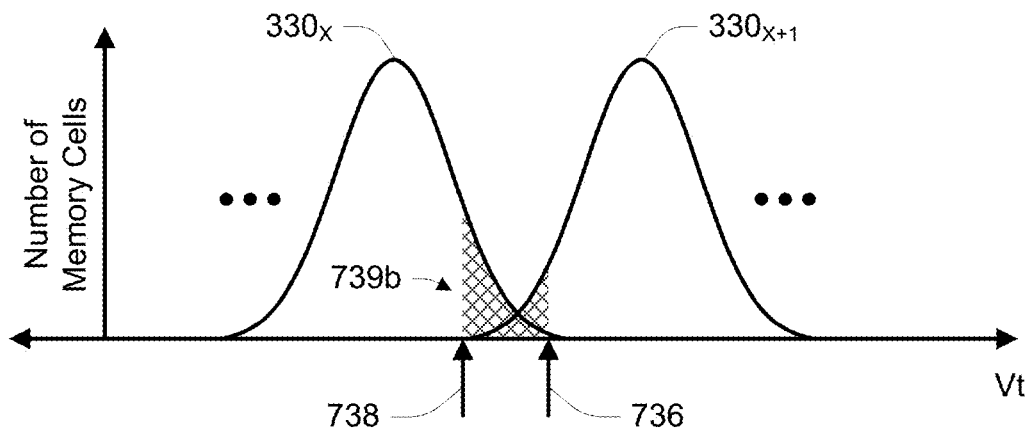
Figure 7C:
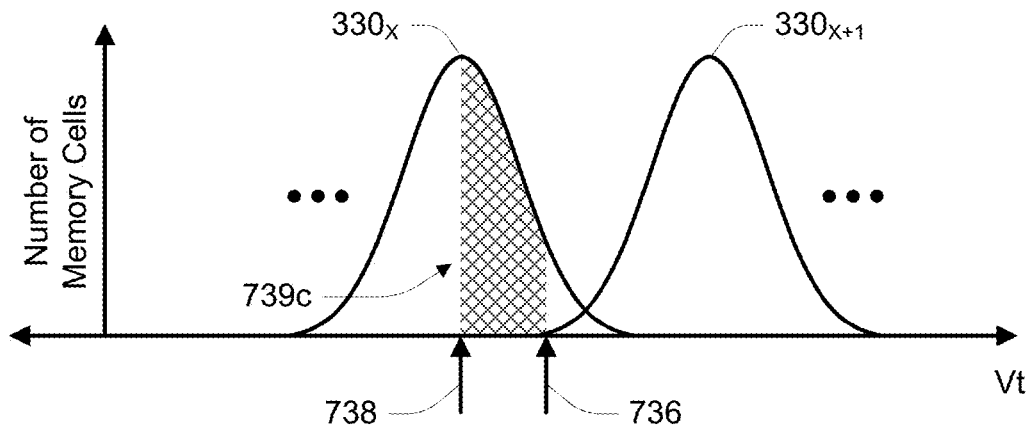

FIGS. 7A-7C are conceptual depictions of adjacent threshold voltage distributions such as depicted in FIGS. 4A-4C in accordance with embodiments. The threshold voltage distributions $330_X$ and $330_{X+1}$ might represent any two adjacent threshold voltage distributions representing the data states to which the memory cells might be assigned, i.e., X could have any integer value 0-14 for the example of FIG. 3. The arrow 736 might represent the target threshold voltage level Vt_target and the arrow 738 might represent the threshold voltage level Vt0.

In FIG. 7A, the shaded area 739a might represent a magnitude of current flow supplied by the variable voltage nodes 584 of the memory cells of the threshold voltage distributions $330_X$ and $330_{X+1}$ having threshold voltages between Vt0 and Vt_target if there is no net charge gain or charge loss experienced by those memory cells. In FIG. 7B, the shaded area 739b might represent a magnitude of current flow supplied by the variable voltage nodes 584 of the memory cells of the threshold voltage distributions $330_X$ and $330_{X+1}$ having threshold voltages between Vt0 and Vt_target if there is charge loss experienced by those memory cells. And in FIG. 7C, the shaded area 739c might represent a magnitude of current flow supplied by the variable voltage nodes 584 of the memory cells of the threshold voltage distributions $330_X$ and $330_{X+1}$ having threshold voltages between Vt0 and Vt_target if there is charge gain experienced by those memory cells. As depicted in Figured 7A-7C, memory cells experiencing charge loss might be expected to experience a lower current demand from their variable voltage nodes 584 relative to memory cells not experiencing a net charge loss or charge gain. Conversely, memory cells experiencing charge gain might be expected to experience a higher current demand from their variable voltage nodes 584 relative to memory cells not experiencing a net charge loss or charge gain.

Provided the magnitude of the charge loss or charge gain is not excessive, e.g., to the point where the foregoing relationships begin to reverse, the relative magnitudes of the current demand can be used to indicate a direction and magnitude of the threshold voltage shift. In response to determining an expected direction and magnitude of the threshold voltage shift, a deboost voltage level might be determined that might be expected to compensate for the detected threshold voltage shift. This might result in memory cells having threshold voltages higher than the local minima between the two adjacent threshold voltage distributions being deemed to be deactivated, and memory cells having threshold voltages lower than the local minima being deemed to be activated. Alternatively, or in addition, the relationship between a desired deboost voltage level and the current demand might be expressed as a function or stored in a look-up table in, or otherwise accessible to, the memory. In general, lower deboost voltage levels might be applied in response to charge gain, while higher deboost voltage levels might be applied in response to charge loss.

Table 2 might be an example of a look-up table for deboost voltage level as a function of measured current demand. In Table 2, Vdefault might represent a default deboost voltage level, e.g., that might be used if little or no threshold voltage shift were detected. The relationship between the various voltage levels of the deboost voltage level might be V1>V2>Vdefault>V3>V4. While five rows of a look-up table are depicted in Table 2, fewer or more rows might be used.

TABLE 2

Deboost Voltage Level as a Function of Measured Current Demand

| Measured Current Demand (A) | Deboost Voltage Level (V) |
| --- | --- |
| A1 <= A < A2 | V1 |
| A2 <= A < A3 | V2 |
| A3 <= A < A4 | Vdefault |
| A4 <= A < A5 | V3 |
| A5 <= A <= A6 | V4 |

Figure 8:
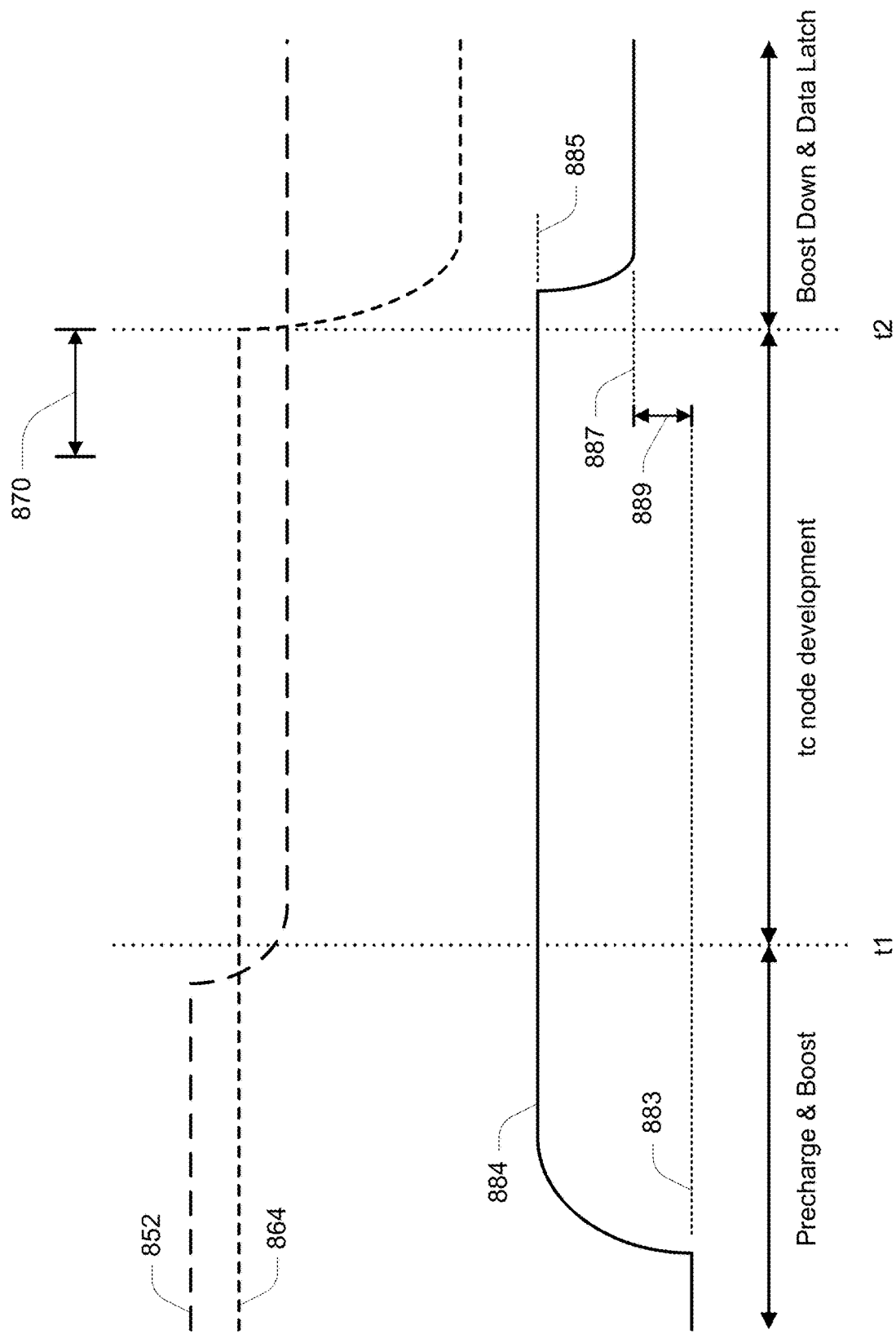
FIG. 8 is a timing diagram generally depicting voltage levels of various nodes of a sense circuit such as depicted in FIG. 5 at various stages of a sense operation in accordance with an embodiment.

FIG. 8 is a timing diagram generally depicting voltage levels of various nodes of a sense circuit such as the sense circuit 500 depicted in FIG. 5 at various stages of a sense operation in accordance with an embodiment. With reference to FIGS. 8 and 5, the trace 884 might represent the voltage level of the output of the variable voltage node 584, the trace 864 might represent the voltage level of the control signal tc_iso applied to the signal line 564 connected to the control gate of the transistor 562, and the trace 852 might represent the voltage level of the control signal blclamp2 applied to the signal line 552 connected to the control gate of the transistor 550.

During a precharge and boost phase of the sense operation, the voltage level of the control signal tc_iso (trace 864) might be sufficient to initially activate the transistor 562, and the voltage level of the control signal blclamp2 (trace 852) might be sufficient to initially activate the transistor 550. The voltage level of the output of the variable voltage node 584 (trace 884) might then be increased from an initial voltage level 883 to a boost voltage level 885. The initial voltage level 883 might be a reference potential, such as ground, Vss or 0V. At or around time t1, the voltage level of the control signal blclamp2 might be reduced.

At time t1, the tc node 574 is allowed to develop, e.g., selectively discharging depending upon whether the NAND string 206 connected to the data line 204 is conducting current, e.g., whether the selected memory cell is conducting current. This might be referred to as the tc node development phase of the sense operation. If the current level of the selected memory cell is above A0 (FIG. 6), the transistor 550 might be activated, and the memory cell current might be supplied by the voltage node 572. If the current level of the selected memory cell is below A0, the transistor 550 might be deactivated, and the memory cell current might be supplied by the voltage node 584. At time t2, the control signal tc_iso might be decreased to deactivate the transistor 562 and isolate the tc node 574 from the data line 204 during subsequent deboosting. After time t2, the voltage level of the output of the variable voltage node 584 might be decreased, e.g., deboosted, to a deboost voltage level 887, and the data value might be sensed and latched in manners well understood in the art.

For various embodiments, the current demand of the capacitances 576 for a set of sense circuits, e.g., corresponding to a grouping of memory cells selected for sensing, might be measured during the period of time 870. This might include measuring current demand of one or more voltage nodes 584 connected to the capacitances 576 for the set of sense circuits. A set of sense circuits might include each sense circuit configured to sense a data state of a memory cell selected for sensing during a sense operation, or each sense circuit configured to sense a data state of some subset of memory cells selected for sensing during the sense operation. For example, a logical page of memory cells selected for sensing during a sense operation might include 16K memory cells connected to a selected access line whose NAND strings are connected to 16K sense circuits, respectively. The measurement of current demand could be based on each voltage node connected to a capacitance of each of the 16K sense circuits. Note that a single voltage node might be connected to capacitances of more than one sense circuit.

Threshold voltage shift might be variable among the logical page of memory cells due to such factors as differing fabrication conditions along the access line, differing ambient conditional along the access line, different programming conditions along the access line, etc. As such, it may be beneficial to perform the measurement of current demand for subsets of the memory cells selected for the sense operation that might be expected to experience similar, or more similar, levels of threshold voltage shift. For example, the 16K memory cells of the logical page of the foregoing example might be divided into four subsets of 4K memory cells each. Each subset of memory cells might represent a contiguous grouping of memory cells along the selected access line. A variable voltage node should generally correspond to only one subset of memory cells.

As noted previously, the threshold voltage level Vt0 might be dependent upon the boost voltage level 885. For embodiments determining current demand corresponding to multiple subsets of memory cells of a sense operation, different boost voltage levels could be used in order to obtain additional information about the magnitude of any threshold voltage shift. For example, with reference to FIG. 6, moving Vt0 might change the cell current level that can be supplied by the capacitance, and thus the variable voltage node. By comparing current demand for sensing of one subset of memory cells using a first boost voltage level to the current demand for sensing of different subset of memory cells using a second boost voltage level, different than the first boost voltage level, information indicating the number of memory cells having threshold voltages between the Vt0 for the first boost voltage level and the Vt0 for the second boost voltage level might be determined. This information might better inform the magnitude of the adjustment of the deboost voltage level.

The period of time 870 might represent a period of time extending from time t2, e.g., when the tc node 574 is isolated from the data line 204, to some time before time t2. The period of time 870 might represent the last 20% of the tc node development phase of the sense operation. Alternatively, the period of time 870 might represent some period of time less than the last 20% of the tc node development phase of the sense operation.

The deboost voltage level 887 might be selected in response to the measurement of current demand. If the current demand is determined to be within a predefined range, which might include being equal to some target current level, the deboost voltage level 887 might be selected to be some default value selected in response to desired operation of the sense circuit under the presumption that the memory cells have not experienced a net charge gain or charge loss. For current demand determined to be outside the predefined range, the deboost voltage level 887 might be selected to be higher or lower than the default value to compensate for detected threshold voltage shift. Selecting the deboost voltage level 887 in response to a level of current demand might include selecting a voltage difference 889 in response to the level of current demand and adding the voltage difference 889 (e.g., absolute value of the voltage difference 889) to the initial voltage level 883. In general, lower deboost voltage levels (e.g., closer to the initial voltage level 883 than the default value) might be applied in response to charge gain, while higher deboost voltage levels (e.g., farther from the initial voltage level 883 than the default value) might be applied in response to charge loss.

Figure 9:
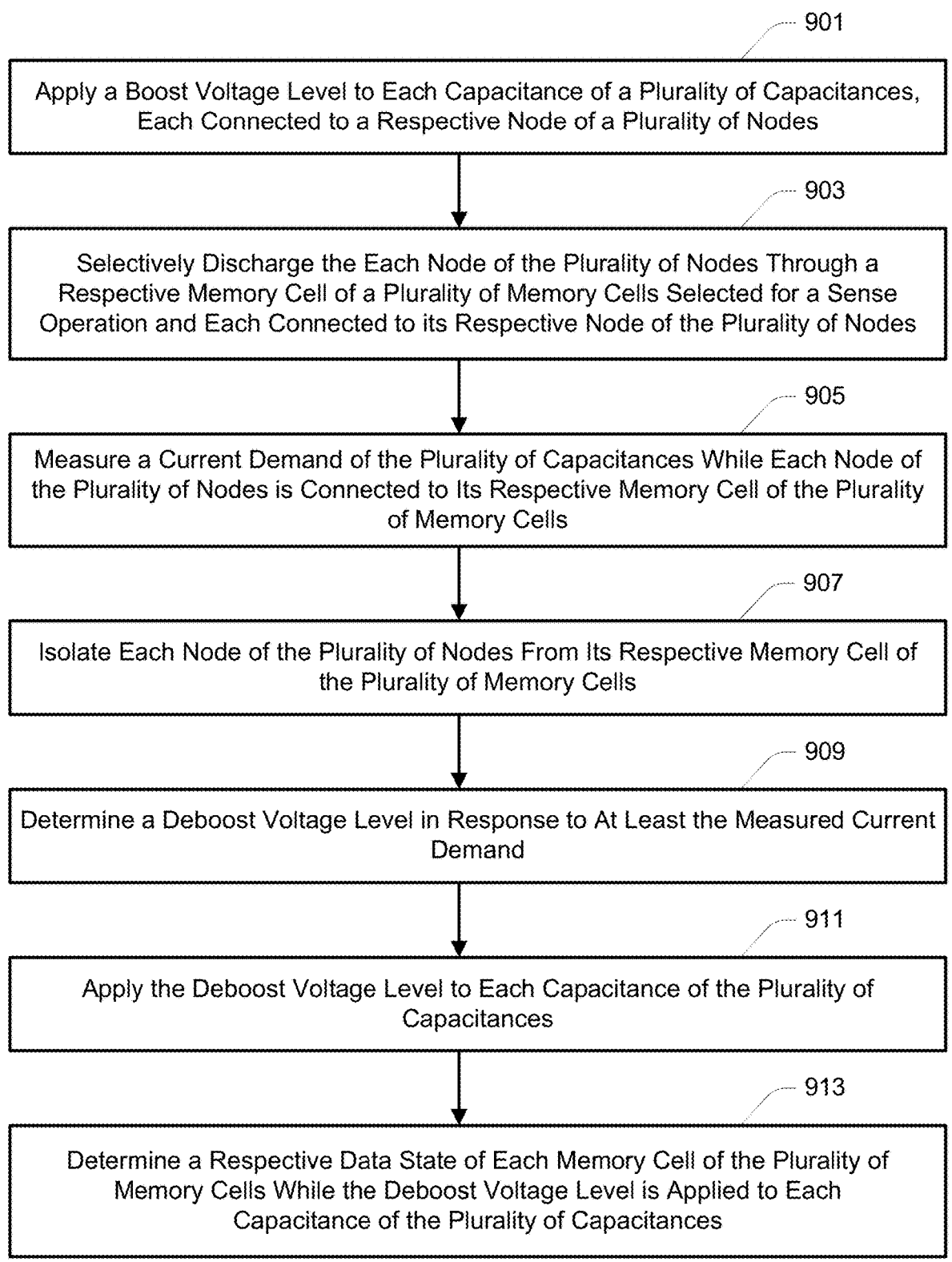
FIG. 9 depicts a flowchart of a method of operating a memory according to an embodiment.

FIG. 9 depicts a flowchart of a method of operating a memory according to an embodiment, e.g., during a sense operation in accordance with an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 901, a boost voltage level might be applied to each capacitance of a plurality of capacitances, each connected to a respective node of a plurality of nodes. For example, the boost voltage level might be applied to a capacitance 576 by a variable voltage node 584 during, and as part of, the sense operation for a plurality of memory cells selected for the sense operation. The plurality of memory cells might include each memory cell selected for the sense operation, or some subset of all of the memory cells selected for the sense operation. Each capacitance 576 might be connected to a corresponding tc node 574. At 903, each node of the plurality of nodes might be selectively discharged through its respective memory cell of the plurality of memory cells selected for the sense operation and connected to its respective node of the plurality of nodes. For example, each tc node 574 might be selectively discharged through a respective memory cell of a respective NAND string 206 to the source 216 depending upon whether that memory cell is activated in response to a sense voltage applied to its control gate, e.g., depending upon its data state. As is common, all remaining memory cells of each NAND string 206 might receive a pass voltage sufficient to activate those memory cells regardless of their data states.

At 905, the current demand of the plurality of capacitances might be measured while each node is connected to its respective memory cell. Measuring the current demand of the capacitances might include measuring a current demand of voltage node (e.g., variable voltage node) connected to one electrode of each of the capacitances, or it might include measuring a current demand of a plurality of voltage nodes (e.g., variable voltage nodes), each connected to one or more capacitances of the plurality of capacitances, and summing those measured current demands. At 907, each node of the plurality of nodes might be isolated from its respective memory cell. For example, each tc node 574 might be isolated from its respective NAND string 206 by deactivating a respective transistor 562.

At 909, a deboost voltage level might be determined in response to the measured current demand. As discussed with reference to FIGS. 6 and 7A-7C, the current demand of the capacitances 576 might generally be dependent upon threshold voltage levels of the memory cells connected to them relative to the voltage level of the sense voltage applied to their control gates. At 911, the deboost voltage level might be applied to each capacitance of the plurality of capacitances. At 913, a data state might be determined for each memory cell of the plurality of memory cells while the deboost voltage level is applied to each capacitance of the plurality of capacitances. For example, if the voltage level of a tc node 574 is below a trip point (e.g., below the threshold voltage) of the transistor 578, the transistor 578 might be deactivated. Upon activating the transistor 586, the output 566 of the sense circuit might remain isolated from the voltage node 590, and thus remain in a logic high state indicating that the memory cell is deemed to be activated in response to the sense voltage. Conversely, if the voltage level of a tc node 574 is above the trip point (e.g., above the threshold voltage) of the transistor 578, the transistor 578 might be activated. Upon activating the transistor 586, the output 566 of the sense circuit might be connected to the voltage node 590, and thus transition to a logic low state indicating that the memory cell is deemed to be deactivated in response to the sense voltage. It is noted that various embodiments might facilitate more accurate determinations of intended data states over methods using a default deboost voltage level, and may facilitate such increased accuracy without a penalty in read time.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:
1. A memory, comprising:
an array of memory cells;
a sense circuit;
a voltage node; and
a controller for access of the array of memory cells, wherein the controller is configured to cause the memory to:
capacitively couple a first voltage level from the voltage node to a node of the sense circuit;
selectively discharge the node of the sense circuit through a memory cell while capacitively coupling the first voltage level to the node of the sense circuit;
measure a current demand of the voltage node while selectively discharging the node of the sense circuit through the memory cell;
determine a second voltage level in response to the measured current demand;
isolate the node of the sense circuit from the memory cell;

capacitively couple the second voltage level from the voltage node to the node of the sense circuit after isolating the node of the sense circuit from the memory cell; and determine a data state of the memory cell in response to a voltage level of the node of the sense circuit while capacitively coupling the second voltage level to the node of the sense circuit.

2. The memory of claim 1, wherein the sense circuit comprises a capacitor having a first electrode connected to the node of the sense circuit and having a second electrode connected to the voltage node.

3. The memory of claim 2, wherein the controller being configured to cause the memory to capacitively couple the first voltage level from the voltage node to the node of the sense circuit comprises the controller being configured to cause the memory to apply the first voltage level from the voltage node to the second electrode of the capacitor.

4. The memory of claim 3, wherein the controller being configured to cause the memory to capacitively couple the second voltage level from the voltage node to the node of the sense circuit comprises the controller being configured to cause the memory to apply the second voltage level from the voltage node to the second electrode of the capacitor.

5. The memory of claim 1, wherein the controller being configured to determine the second voltage level in response to the measured current demand comprises the controller being configured to cause the memory to select a value of the second voltage level from a look-up table.

6. The memory of claim 1, wherein the controller being configured to cause the memory to determine the second voltage level in response to the measured current demand comprises the controller being configured to cause the memory to determine the second voltage level to be higher than a default voltage level in response to the measured current demand being lower than a threshold value, and to determine the second voltage level to be lower than the default voltage level in response to the measured current demand being higher than the threshold value.

7. The memory of claim 6, wherein the controller being configured to cause the memory to determine the second voltage level in response to the measured current demand comprises the controller being configured to cause the memory to determine the second voltage level to be higher than a default voltage level in response to the measured current demand being lower than a range of current demand levels, and to determine the second voltage level to be lower than the default voltage level in response to the measured current demand being higher than the range of current demand levels.

8. The memory of claim 1, wherein the controller is further configured to cause the memory to apply a sense voltage to a control gate of the memory cell while measuring the current demand of the voltage node.

9. The memory of claim 8, wherein the memory cell is a selected memory cell of a string of series-connected memory cells, and wherein the controller is further configured to apply a pass voltage to a respective control gate of each memory cell of the string of series-connected memory cells other than the selected memory cell while applying the sense voltage to the control gate of the selected memory cell.

10. The memory of claim 1, wherein the memory cell is a selected memory cell of a sense operation to be performed by the memory, and wherein the controller is further configured to cause the memory to:

selectively discharge the node of the sense circuit through the selected memory cell while capacitively coupling the first voltage level to the node of the sense circuit during a development phase of the sense operation; and measure a current demand of the voltage node while selectively discharging the node of the sense circuit through the memory cell during the development phase of the sense operation.

11. The memory of claim 10, wherein the controller is further configured to cause the memory to determine the second voltage level in response to the measured current demand during the development phase of the sense operation.

12. A memory, comprising:

an array of memory cells;

a plurality of sense circuits, wherein each sense circuit of the plurality of sense circuits is selectively connected to a respective memory cell of a plurality of memory cells of the array of memory cells;

a voltage node; and a controller for access of the array of memory cells, wherein the controller is configured to cause the memory to:

precharge a respective node of each sense circuit of the plurality of sense circuits to a first voltage level;

capacitively couple a second voltage level from the voltage node to the respective node of each sense circuit of the plurality of sense circuits;

for each sense circuit of the plurality of sense circuits, selectively discharge its respective node through its respective memory cell while capacitively coupling the second voltage level to its respective node;

measure a current demand of the voltage node while capacitively coupling the second voltage level to the respective node of each sense circuit of the plurality of sense circuits and selectively discharging the respective node of each sense circuit of the plurality of sense circuits;

determine a third voltage level in response to the measured current demand;

for each sense circuit of the plurality of sense circuits, isolate its respective node from its respective memory cell;

capacitively couple the third voltage level from the voltage node to the respective node of each sense circuit of the plurality of sense circuits while the respective node of each sense circuit of the plurality of sense circuits is isolated from its respective memory cell; and for each sense circuit of the plurality of sense circuits, determine a respective data state of its respective memory cell in response to a voltage level of its respective node while capacitively coupling the third voltage level to its respective node.

13. The memory of claim 12, wherein the third voltage level is lower than the second voltage level.

14. The memory of claim 12, wherein the controller being configured to cause the memory to capacitively couple the second voltage level from the voltage node to the respective node of each sense circuit of the plurality of sense circuits comprises the controller being configured to cause the memory to increase a voltage level of an output of the voltage node from an initial voltage level to the second voltage level.

15. The memory of claim 14, wherein the controller being configured to cause the memory to determine the third voltage level in response to the measured current demand comprises the controller being configured to cause the memory to:

determine a voltage difference in response to the measured current demand; and add the voltage difference to the initial voltage level to determine the third voltage level.

16. The memory of claim 12, wherein the current demand is a first current demand, wherein the voltage node is a first voltage node, wherein the plurality of sense circuits is a first plurality of sense circuits, wherein the plurality of memory cells is a first plurality of memory cells of the array of memory cells, and wherein the memory further comprises:

a second plurality of sense circuits, wherein each sense circuit of the second plurality of sense circuits is selectively connected to a respective memory cell of a second plurality of memory cells of the array of memory cells; and a second voltage node wherein the controller is further configured to cause the memory to:

precharge a respective node of each sense circuit of the second plurality of sense circuits to the first voltage level;

capacitively couple the second voltage level from the second voltage node to the respective node of each sense circuit of the second plurality of sense circuits;

for each sense circuit of the second plurality of sense circuits, selectively discharge its respective node through its respective memory cell while capacitively coupling the second voltage level to its respective node;

measure a second current demand of the second voltage node while capacitively coupling the second voltage level to the respective node of each sense circuit of the second plurality of sense circuits and selectively discharging the respective node of each sense circuit of the second plurality of sense circuits;

determine a fourth voltage level in response to the measured second current demand;

for each sense circuit of the second plurality of sense circuits, isolate its respective node from its respective memory cell;

capacitively couple the fourth voltage level from the second voltage node to the respective node of each sense circuit of the second plurality of sense circuits while the respective node of each sense circuit of the second plurality of sense circuits is isolated from its respective memory cell; and for each sense circuit of the second plurality of sense circuits, determine a respective data state of its respective memory cell in response to a voltage level of its respective node while capacitively coupling the fourth voltage level to its respective node.

17. The memory of claim 16, wherein, for each sense circuit of the first plurality of sense circuits and for each sense circuit of the second plurality of sense circuits, its respective memory cell is a selected memory cell of a sense operation to be performed by the memory.

18. The memory of claim 17, wherein a union of the respective memory cell for each sense circuit of the first plurality of sense circuits and the respective memory cell for each sense circuit of the second plurality of sense circuits includes less than all selected memory cells of the sense operation.

19. A memory, comprising:

an array of memory cells;

a sense circuit;

a voltage node; and a controller for access of the array of memory cells, wherein the controller is configured to cause the memory to:

apply a first voltage level to a first electrode of a capacitance of the sense circuit from the voltage node while a second electrode of the capacitance is connected to a memory cell of the array of memory cells;

measure a current demand of the voltage node while applying the first voltage level to the first electrode of the capacitance and while the second electrode of the capacitance is connected to the memory cell;

determine a second voltage level in response to the measured current demand; and apply the second voltage level to the first electrode of the capacitance from the voltage node while the second electrode of the capacitance is isolated from the memory cell.

20. The memory of claim 19, wherein the controller is further configured to cause the memory to determine a data state of the memory cell while applying the second voltage level to the first electrode of the capacitance.

21. The memory of claim 19, wherein the controller is configured to cause the memory to isolate the second electrode of the capacitance from the memory cell after determining the second voltage level.

22. The memory of claim 19, wherein the second voltage level is lower than the first voltage level and higher than a reference potential of the memory.

* * * * *